United States Patent [19]

Shih et al.

[11] Patent Number: 4,809,339
[45] Date of Patent: Feb. 28, 1989

[54] AUDIO TRANSDUCER

[76] Inventors: Kelvin Shih, 908 Devonshire, Brighton, Mich. 48116; Peter A. Hochstein, 2966 River Valley Dr., Troy, Mich. 48098

[21] Appl. No.: 8,073

[22] Filed: Jan. 27, 1987

Related U.S. Application Data

[63] Continuation of Ser. No. 775,174, Sep. 12, 1985, abandoned.

[51] Int. Cl.$^4$ ............................................. H03G 3/20
[52] U.S. Cl. ............................................. 381/110
[58] Field of Search ........................... 381/28, 77, 110

[56] References Cited

U.S. PATENT DOCUMENTS

| | | | |
|---|---|---|---|
| 3,924,070 | 12/1975 | Seaver | 381/110 |
| 3,992,585 | 11/1976 | Turner | 381/110 |
| 4,411,020 | 10/1983 | Imazeki | 455/343 |
| 4,441,086 | 4/1984 | Karlow | 381/94 |
| 4,453,264 | 6/1984 | Hochstein | 381/110 |
| 4,531,237 | 7/1985 | Bar-on | 455/343 |

OTHER PUBLICATIONS

Linear Data Book, (National Semiconductor), 1976, pp. 9-26, 9-27.

Radio Shack 1985 Catalog (copyright 1984), p. 21, 40-1259.
"Sound Operated Switch", by M. Tooley and David Whitfield, Practical Electronics, May 1979, vol. 15, No. 5, pp. 46-49, National Semiconductor, Linear Applications, p. AN69-2, Dec. 1972.

*Primary Examiner*—Forester W. Isen
*Attorney, Agent, or Firm*—Reising, Ethington, Barnard, Perry & Milton

[57] ABSTRACT

A method and circuit for supplying power from a constantly available power source (20) to an audio power amplifier (14) for a speaker (12) utilizing input leads (16,18) having an audio signal. A pre-amplifier (24) is used for amplifying the audio signal having a difference in potential between the input leads (16,18). A switch (58) powers the audio power amplifier (14) and pre-amplifier (24) from the power source (20) in response to a control signal. The method and circuit is characterized by sensing (26) the existence of a diminished audio signal by determining a greater difference than the predetermined difference between the input leads (16,18) to produce the control signal which operates a relay driver transistor (62) which, in turn, operates a relay switch (66) to supply power to the pre-amplifier (24) and power amplifier (14).

30 Claims, 2 Drawing Sheets

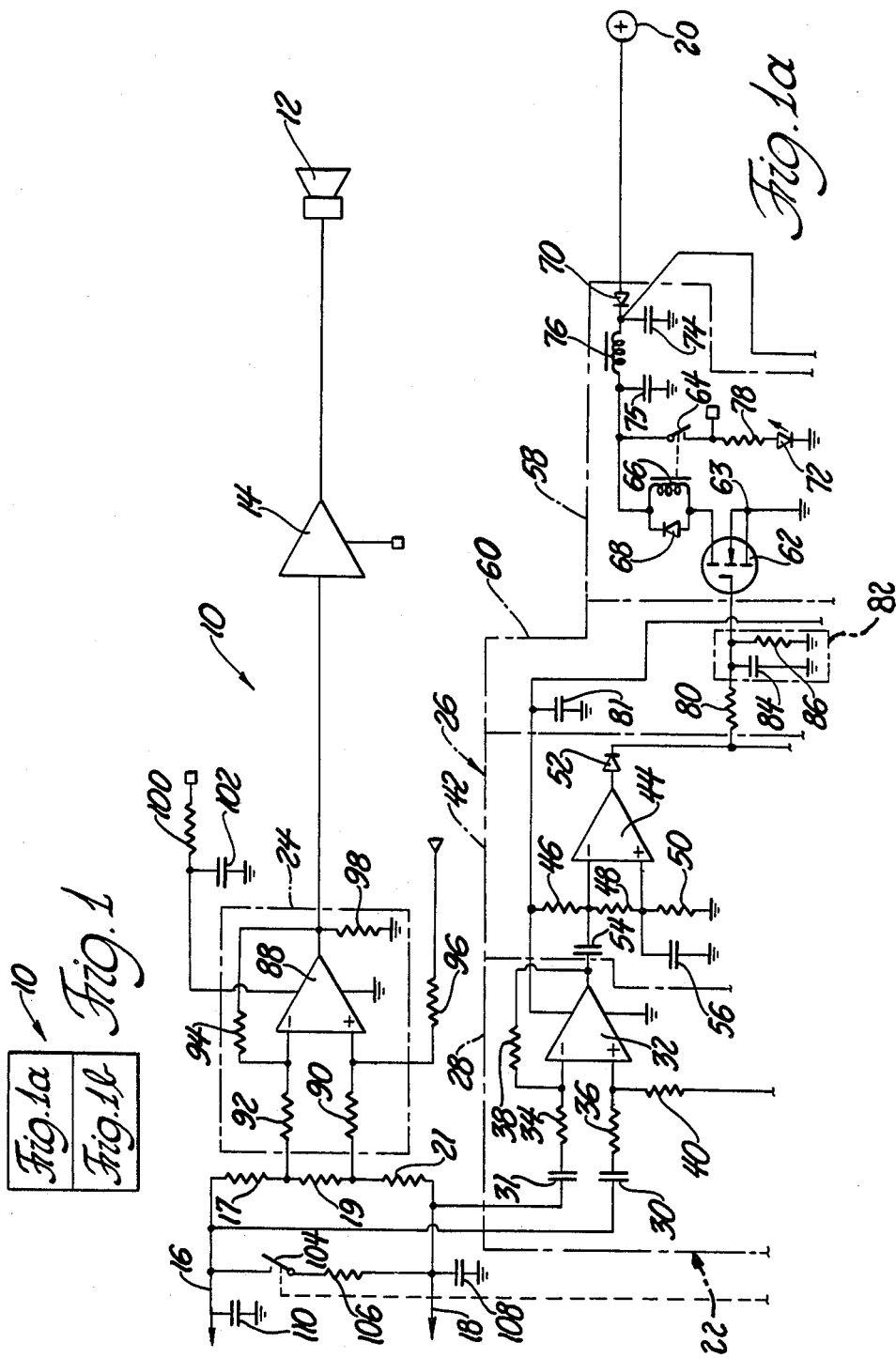

AUDIO TRANSDUCER

This application is a continuation of application Ser. No. 775,174, filed 9/12/85 now abandoned.

TECHNICAL FIELD

The subject invention relates to audio transducers and, particularly, audio speakers utilized with automotive radios.

BACKGROUND ART

Audio speakers are extensively utilized in automobiles to generate acoustic signals from the automotive radio. It is often desired to improve the quality of the speakers in an automobile. This is typically accomplished by replacing the speakers in the automobile with speakers which are amplified by having an amplifier supported by or connected directly to the speaker. A power control circuit and method for selectively supplying power from a constantly available power source to the audio amplifier has been used. The control circuit uses a differential input to produce a control signal by sensing the existence of an audio signal at the input to the radio amplifier by determining the difference in potential between the input leads. A switching means is utilized to close a power switching circuit to power the audio amplifier from the power source in response to the control signal so that the power amplifier does not receive power in the absence of an audio input signal.

The disadvantage with such a control circuit is that at low potential differences between the input leads, the differential sensing means will not operate to produce the control signal. Therefore, the potential difference between the input leads must be at a reasonable value in order to operate the differential sensing means to produce an amplified output response for the audio amplifier. In other words, once the audio radio initially sends an audio signal to the power control circuit, an acoustic audio signal will not be produced until the potential of the audio signal from the audio radio is large enough to operate the differential sensing means. Thus, the audio amplifier will not automatically receive power once the audio radio initially sends an audio signal.

STATEMENT OF INVENTION AND ADVANTAGES

A power control circuit and method for selectively supplying power from a constantly available power source to an audio amplifier means for an acoustic transducer of the type wherein first and second input leads receive the audio signal, either differentially with neither lead grounded, or receive the input signal in reference to ground with one input lead grounded. A pre-amplifier means is utilized to produce a single amplified response by amplifying a predetermined audio signal having a predetermined difference in potential between the input leads. A switching means is utilized to close a power switching circuit to power the audio amplifier means and pre-amplifier means from the power source in response to a control signal. A sensing means is utilized to produce the control signal by sensing the existence of a diminished audio signal by determining a greater difference than the predetermined difference in potential between the input leads to produce a control signal to operate the switch means to close the power circuit.

Accordingly, an amplified audio speaker utilizing the subject invention may be substituted for the existing speaker in an automobile without running a power lead from the amplifier back to the radio, however, power will not be drained from the constantly available power source in accordance with the instant invention unless an audio signal is being sent to the amplified speaker over the existing speaker leads. When an audio signal is being sent to the amplified speaker, the subject invention will sense the existence of that audio signal and close a switch whereby power is supplied from the constantly available nearby power source to the pre-amplifier and amplifier for the speaker. Also, if the potential of the audio signal is too low to be sensed by conventional differential sensing means, this sensing means will sense the low potential audio signal and produce a control signal to close the switching circuit to power both the pre-amplifier means and power amplifier means, providing a signal to the speaker voice coil in order to generate the audio acoustic signal. Hence, an audio acoustic signal will be produced any time an audio signal that has a potential difference is sent from the audio radio across the input leads.

FIGURES IN THE DRAWINGS

Other advantages of the present invention will be readily appreciated as the same becomes better understood by reference to the following detailed description when considered in connection with the accompanying drawings wherein:

FIG. 1 shows how FIGS. 1a and 1b fit together.

FIG. 1a is a circuit schematic of the left channel of the invention; and

DESCRIPTION OF THE PREFERRED EMBODIMENT

Figure 1B:
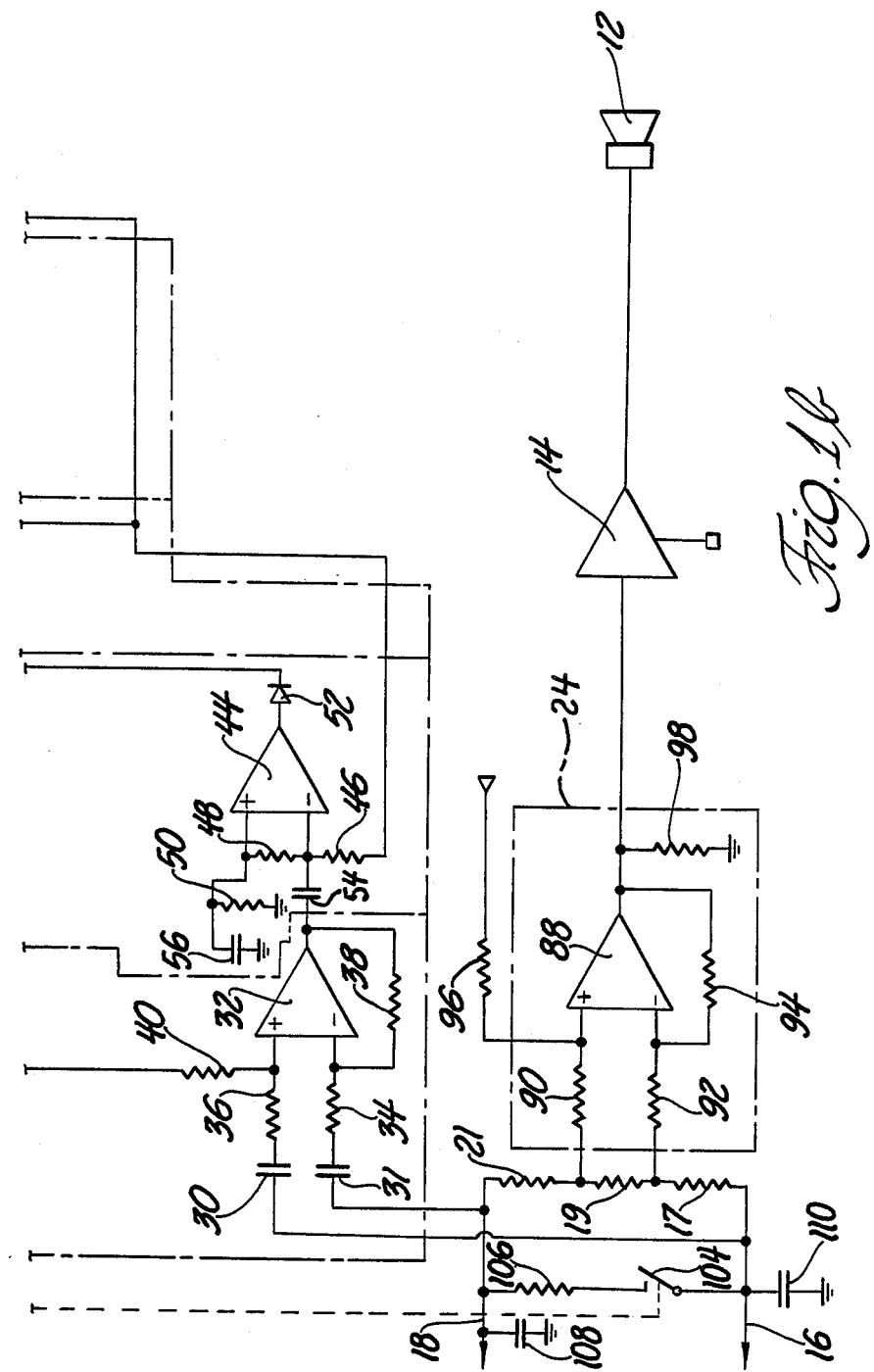
FIG. 1b is a circuit schematic of the right channel which is a mirror of the left channel containing the same components at the same value.

An acoustic transducer or speaker assembly utilizing the subject invention is generally shown at 10. The assembly 10 includes a transducer or speaker 12 which is of a type well known in the art for converting variations of electrical energy in an audio signal into corresponding variations of acoustic energy. The assembly also includes audio power amplifier means 14 for amplifying the audio signal supplied to the assembly from a radio or the like. The power amplifier 14 may be one of well-known types and may be supported on the speaker or speaker housing.

The assembly 10 includes first and second signal leads 16 and 18 for receiving an audio signal from a radio or the like. As alluded to above, one of the signal leads 16 or 18 may be a ground lead which is connected to the vehicle body to establish a ground. Instead of an actual wire lead, one of the leads 16 or 18 may be represented by the housing of the speaker being directly grounded to a portion of the vehicle body. The other of the signal leads 16 and 18 would then extend to the radio for receiving the audio signal. In such a case there would be a potential difference between the leads 16 and 18, that is, there would clearly be a potential difference between one of the leads 16 or 18 and the ground on the other lead 16 or 18. Alternatively, both of the signal leads 16 and 18 may lead to the radio for receiving an audio signal, in which case neither of the leads 16 or 18 would be grounded but there would be a potential difference between the leads 16 or 18 when an audio signal is being transmitted to the assembly 10.

The assembly 10 also includes a power lead 20 for attachment to a source of constant power for supplying power to the audio amplifier means 14 and the preamplifier means 24. In other words, the power lead 20 may be attached to a hot lead in the automobile such as the lead for the trunk light and, in accordance with the power control circuit of the subject invention, generally indicated at 22, power will be supplied to the speaker amplifier 14 and pre-amplifier means 24 in response to an audio signal on the signal leads 16 and 18.

The power control circuit 22 includes pre-amplifier means 24 comprising a differential amplifier 88, first resistor 90, second resistor 92, third resistor 96, fourth resistor 98, and feedback resistor 94 for establishing a given closed loop gain to produce an amplified output response. A fifth resistor 17, sixth resistor 19, and seventh resistor 21 act as a voltage divider so that the differential amplifier 88 receives part of the potential of the audio signal to produce an amplified output response. A resistor 100 and capacitor 102 for stabilizing the power to the pre-amplifier 24 are connected between the pre-amplifier 24 and the power control circuit.

The power control circuit 22 also includes sensing means, generally indicated at 26, for sensing the existence of a diminished audio signal having a difference in potential between the input leads 16 and 18 by determining a greater difference than the predetermined difference in potential between the input leads 16 and 18 to produce a control signal. In other words, the potential of the audio signal across the input leads 16 and 18 is too low to be sensed by conventional differential sensing means or lower than a predetermined potential required to activate the comparator 44. The sensing means 26 will sense the audio signal and produce a control signal to operate the switch means 58 to close the power circuit 64. More specifically, the sensing means 26 comprises a differential amplifier means 28 for amplifying a diminished audio signal from the input lead 16 and 18, and a comparator sensing means 42 for receiving the amplified audio signal to produce a control signal to operate the switch means 58 to close the power circuit. The sensing means 26 also includes a filter means 30 and 31 consisting of a first capacitor 30 and second capacitor 31 receiving the diminished audio signal from the input leads 16 and 18 for filtering out the direct current components of the diminished audio signal to amplify only the alternating current components. The differential amplifier means 28 comprises a differential amplifier 32, first resistor 34, second resistor 36, third resistor 40, and feedback resistor 38 for establishing a given closed loop gain by receiving a diminished audio signal from the filter mean 30 and 31 to produce an amplified audio signal related to the difference between the input leads 16 and 18 out of the differential amplifier 32. In other words, the gain of the differential amplifier can be adjusted by changing the value of the first resistor 34 and the feedback resistor 38. The comparator sensing means 42 comprises a comparator operational amplifier 44 having an inverting and noninverting input for producing a control signal, a first resistor 46 connected to power and the inverting input of comparator op-amp 44, second resistor 48 connected between the invert and third resistor 50 connected to the noninverting input to act as a voltage divider so that the comparator 44 receives part of the potential of the amplified audio signal to produce a control signal. The comparator sensing means 42 further includes a first capacitor 54 for filtering out the direct current components of the amplified audio signal from the differential amplifier 32, and a second capacitor 56 to filter out direct current components from the ground reference. An output diode 52 connected to the comparator 44 unidirectionally charges capacitor 84 and prevents leakback current from the capacitor 84.

The power control circuit 22 also includes switch means 58 for powering the audio amplifier means 14 and pre-amplifier means 24 from the power source 20 in response to the control signal from the sensing means 26. More specifically, the switch means 58 comprises a transistor 62 configured as a relay driver. The transistor 62 is a MOS-FET relay driver for receiving the control signal. The switch means 58 also includes switch or relay contact 64 which is opened and closed by a relay 66 which is, in turn, controlled by the transistor 62. The drain of the transistor 62 is connected to the relay 66 and the source 63 of the transistor 62 is connected to ground. A free-wheeling diode 68 in parallel with the relay coil 66 for protecting the transistor 62 by preventing back EMF from damaging the transistor 62. The switch means 58 further includes a light-emitting diode 72 and a resistor 78 between the contacts 64 and ground reference for visually indicating that the contacts 64 are closed. A diode 70 between the power source 20 and inductor 76 is utilized for protecting the circuit 22 against reverse power connections and negative transient power line rejection. A capacitor 74 and 75 are utilized as a power supply filter. In other words, if a lower potential of power is being delivered from the power source 20, the capacitors 74 and 75 will supply the remaining current potential needed to operate the sensing means 26. An inductor 76 is also used for filtering out noise in the input power from the power source 20 to the entire circuit 22.

The switch means 58 also includes integrator means 60 for combining the control signal from either channel or both and limiting the potential of the control signal to operate the switch means 58. The integrator means 60 comprises an input resistor 80 which receives the control signal from either channel or both for limiting the potential of the control signal to the transistor 62, a capacitor 81 interconnecting the differential amplifier 32 and the ground reference for filtering out direct current components, a time-delay means 82 for delaying the opening of the power circuit 64 to discontinue power from the power source 20 to the audio power amplifier means 14 and pre-amplifier means 24 for a period of time after the control signal to the transistor 62 is discontinued as a result of the absence of an audio signal on the input signal leads 16 and 18. The time-delay means 82 includes a capacitor 84 interconnecting the output of the input resistor 80 and ground. The output of the input resistor 80 charges the capacitor 84 so that when the control signal is discontinued, the charge stored in the capacitor 58 continues to power transistor 62 for a period of time. The time-delay circuit 82 includes a resistor 86 interconnecting the capacitor 84 and ground for slowly and controllably discharging capacitor 84 in a given period of time, thereby turning off the transistor 62. By way of example, the energy stored in the capacitor 58 could maintain the switch 64 closed for approximately 40 seconds after the absence of an audio signal on the input leads 16 and 18.

A resistor 106 is placed in parallel with fifth resistor 17, sixth resistor 19, and seventh resistor 21 so that the audio radio will sense the resistance of a simulated speaker. A switch 104 may be closed so that the resistor 106 will be activated, and allows the subject invention to be used with audio radios requiring different load resistances. A capacitor 108 between resistor 106 and the ground reference and capacitor 110 between the switch 104 and the ground reference act as a filter to filter out direct current components of the audio signal from the ground reference.

The following are values for the various components which may be used in a circuit made in accordance with the subject invention, it being understood that the values are exemplary and various combinations of value may be used in the various components utilized in practicing the invention.

LIST OF COMPONENTS

Resistor 17: 3.3
Resistor 19: 2.7
Resistor 21: 3.3
Capacitor 30: 0.1 microfarads
Capacitor 31: 0.1 microfarads
OP Amp 32: LM 324
Resistor 34: 4.7K
Resistor 36: 4.7K
Resistor 38: 100K
Resistor 40: 1Meg
OP Amp 44: LM 324
Resistor 46: 1Meg
Resistor 48: 10K
Resistor 50: 1Meg
Diode 52: 1N4148
Capacitor 54: 0.1 microfarads
Capacitor 56: 0.1 microfarads
Transistor 62: IRFD-213
Relay 66: Hasco SSD 105P-DC 12V
Diode 68: 1N4004
Diode 70: 6A1
Diode 72: LN21 RP-HL
Capacitor 74: 2,200 microfarads
Capacitor 75: 2,200 microfarads
Inductor 76: 500 mH
Resistor 78: 470
Resistor 80: 4.7K
Capacitor 84: 10 microfarads
Resistor 86: 5.6Meg
OP Amp 88: LM 358
Resistor 90: 100K
Resistor 92: 100K
Resistor 94: 100K
Resistor 96: 100K
Resistor 98: 10K
Resistor 100: 100
Capacitor 102: 10 microfarads
Resistor 106: 10 ohms
Capacitor 108: 0.01 microfarads
Capacitor 110: 0.01 microfarads Accordingly, in accordance with the subject invention, there is provided a method of supplying power from a constantly available or hot power source 20 to a audio power amplifier means 14 associated with an acoustic transducer or speaker 12 which is of the type utilizing first and second input leads 16 and 18 having a difference in potential in response to an audio signal from a radio, or the like, including the steps of producing a control signal by pre-amplifying 24 a predetermined audio signal having a difference in potential between the leads 16 and 18 to produce an amplified output response when at a reasonable potential, closing 58 a power circuit by a switch or contact 64 in response to the control signal to allow power from the power source 20 to power the audio power amplifier means 14 and pre-amplifier means 24. This is accomplished specifically by sensing 26 the existence of a diminished audio signal by determining a greater difference than the predetermined difference in potential between the input leads 16 and 18 to produce the control signal to operate the switch means 58 to close the power circuit. More specifically, the sensing 26 is accomplished by amplifying 28 the diminished audio signal, and comparing 42 the amplified audio signal to produce the control signal to operate the switch means 58 to close the power circuit. The method includes the filtering out of direct current components with capacitors 30 and 31 of the audio signal to amplify with the differential amplifier 32 only the alternating current components to produce the amplified audio signal. The method further includes integrating 60 the control signal from either channel or both and limiting the potential of the control signal to operate the transistor 62 of the switch means 58. The method further includes the step of delaying the opening of the power circuit contacts 64 to discontinue the power from the power source 20 to the audio power amplifier means 14 and pre-amplifier means 24 by the time delay circuit 82 for a period of time after the control signal is discontinued as a result of the absence of an audio signal on the input signal leads 16 and 18.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

What is claimed is:

1. A method of supplying power from a constantly available power source (20) to an audio power amplifier means (14) for an acoustic transducer (12) of the type utilizing first and second input leads (16, 18) having a difference in potential responsive to an audio signal, said method comprising the steps of; detecting (24) a predetermined audio signal having a difference in potential between the input leads (16, 18) to produce an amplified output response for driving the amplifier means (14), sensing the presence of an audio signal for selectively supplying power from the constantly available power source (20) to enable the detecting (24) and to supply power to the amplifier means (14), the sensing (26) of the audio signal being further defined as amplifying (28) the audio signal to produce an amplified audio signal and comparing the amplified audio signal to a minimum magnitude reference voltage to produce a control signal, integrating (60) the control signal and a second control signal in response to an audio signal on a second pair of input leads (16, 18) to form a combined control signal and limiting the potential of the combined control signal to operate the supplying (58) of the power, and closing (58) a power circuit (64) in response to the combined control signal to power the audio power amplifier means (14) and to initiate the detecting (24).

2. A method as set forth in claim 1 further defined as filtering (30, 31) out direct current components of the audio signal to amplify (28) only the alternating current components to produce the control signal.

3. A method as set forth in claim 1 further defined as delaying (82) the opening of the power circuit to discontinue power from the power source (20) to the audio power amplifier means (14) and the pre-amplifying (24) for a period of time after said combined control signal is discontinued as a result of the absence of an audio signal.

4. A power circuit (22, 24) for selectively supplying power from a constantly available power source (20) to an audio amplifier means (14) for an audio transducer (12) of the type utilizing first and second input leads (16, 18) having a difference in potential responsive to an audio signal, said control circuit (22, 24) comprising; pre-amplifier means (24) for detecting an audio signal on the input leads (16, 18) to produce an audio amplified response to apply to the audio amplifier (14), sensing means (26) for selectively supplying power from the constantly available power source (20) to said pre-amplifier means (24) and to an amplifier means (28) for amplifying the audio signal on the input leads (16, 18) to produce an amplified audio signal, and comparator means (42) for comparing said amplified audio signal with a minimum magnitude reference voltage to produce a control signal, integrator means (60) for combining said control signal with a second control signal responsive to a second pair of input leads (16, 18) driving a second audio amplifier and transducer to form a combined control signal, limiting the potential of said combined control signal, and applying said combined control signal to a closing a power circuit (64) to supply power to said preamplifier means (24) and the amplifier means (14) in response to said combined control signal.

5. A circuit as set forth in claim 4 wherein said sensing means (26) further includes filtering means (30, 31) for filtering out direct current components of the audio signal to amplify only the alternating current components to produce said combined control signal.

6. A circuit as set forth in claim 4 including time-delay means (82) for delaying the opening of the power circuit (64) to discontinue power from the power source (20) to the audio power amplifier means (14) and said pre-amplifier means (24) for a period of time after said combined control signal is discontinued as a result of the absence of the audio signal.

7. A circuit as set forth in claim 4 wherein said differential amplifier means (28) comprises; a differential amplifier (32), first resistor (34), second resistor (36), third resistor (40), and feedback resistor (38) for establishing a given closed loop gain by receiving the audio signal from the filter means (30, 31) to produce said amplified audio signal related to the difference between the input leads (16,18).

8. A circuit as set forth in claim 4 wherein said comparator means (42) comprises; a comparator operational amplifier (44), first resistor (46), second resistor (48), and third resistor (50) to act as a voltage divider so that said comparator (44) receives part of the potential of said amplified audio signal to produce said control signal.

9. A circuit as set forth in claim 8 wherein said comparator means (42) further includes an output diode (52) connected to said comparator operational amplifier (44), a first capacitor (54) for filtering out direct current components of said amplified audio signal from said differential amplifier (32), and a second capacitor (56) to filter out direct current components from a ground reference.

10. A circuit as set forth in claim 9 wherein said filter means (30, 31) comprises; a first capacitor (30) and a second capacitor (31) receiving the audio signal from the input leads (16,18).

11. A circuit as set forth in claim 10 wherein said pre-amplifier means (24) comprises; a differential amplifier (88), first resistor (90), second resistor (92), third resistor (96), fourth resistor (98), and feedback resistor (94) for closed loop gain by receiving part of the potential of the audio signal to produce said amplified output response.

12. A circuit as set forth in claim 11 wherein said switch means (58) comprises; a transistor (62) configured as a relay driver, contacts (64), and said power circuit (64) comprising a relay (66) controlled by said transistor (62) for operating said contacts (64).

13. A circuit as set forth in claim 12 including a freewheeling diode (68) in parallel with said relay (66) for protecting said transistor (62).

14. A circuit as set forth in claim 13 wherein said switch means (58) further includes a first diode (70) for protecting said power control circuit (22) against reverse power connections and negative transient power line rejection, a capacitor (74) and (75) as power supply filters, an inductor (76) for filtering the input power from the power source (20) to said circuit (22), and a resistor (78) and light-emitting diode (72) between said contacts (64) and ground reference for visually indicating that said contacts (64) are closed.

15. A circuit as set forth in claim 14 wherein said integrator means (60) comprises; an input resistor (80) which receives said control signal from either channel or both for limiting the potential of said control signal from either channel to said transistor (62), a capacitor (81) interconnecting said differential amplifier (32) and the ground reference and said time-delay means (82) comprises; a capacitor (84) and a resistor (86) for discharging said capacitor (84) in a given period of time.

16. An amplified audio speaker assembly (10) comprising; a transducer means (12) for converting variations of electrical energy in an audio signal into corresponding variations of acoustic energy, audio power amplifier means (14) for supplying an audio signal to said transducer means (12), said assembly including input signal leads (16, 18) for receiving an audio signal, said assembly including a power lead (20) for attachment to a source of constant power to supply power to said audio power amplifier means (14), and control circuit means (22, 24) supported by said transducer means (12) including pre-amplifier means (24) for amplifying the audio signal, said control circuit (22, 24) including sensing means (26) for selectively supplying power from the power lead (20) to said power amplifier means (14) and said pre-amplifier means (24), said sensing means (26) including differential amplifier means (28) for amplifying the audio signal to produce an amplified audio signal and comparator means (42) for comparing said amplified audio signal with a minimum magnitude to produce a control signal, integrator means (60) for combining said control signal with a second control signal responsive to a second pair of input leads (16, 18) driving a second audio amplifier and transducer to produce a combined control signal, limiting the potential of said combined control signal, and applying said combined control signal to operate a switch means (58) for closing a power circuit (64) to supply power to said pre-amplifier means (24) and said amplifier means (14) in response to said combined control signal.

17. A circuit as set forth in claim 16 including filter means (30, 31) for filtering out direct current components of the audio signal to amplify only the alternating current components to produce said control signal.

18. A circuit as set forth in claim 16 including time-delay means (82) for delaying the opening of the power circuit (64) to discontinue power from the power source (20) to the audio power amplifier means (14) and pre-amplifier means (24) for a period of time after said combined control signal is discontinued as a result of the absence of an audio signal.

19. A power circuit (22, 24) for selectively supplying power from a constantly available power source (20) to an audio amplifier means (14) for an audio transducer of the type utilizing first and second input leads (16, 18) having a difference in potential responsive to an audio signal, said control circuit (22, 24) comprising; means (24) for detecting an audio signal on the input leads (16, 18), sensing means (26) for selectively supplying power from the constantly available power source (20) to the audio amplifier means (14), said sensing means (26) including differential amplifier means (28) for amplifying the audio signal on the input leads (16, 18) to produce an amplified audio signal and comparator means (42) for comparing said amplified audio signal with a minimum magnitude reference voltage to produce a control signal, integrator means (60) for combining said control signal with a second signal responsive to a second pair of input leads (16, 18) driving a second audio amplifier and transducer to produce a combined control signal, limiting the potential of said combined signal, and applying said combined control signal to operate a switch means (58) for closing a power circuit (62) to supply power to the audio amplifier means (14) in response to said control signal.

20. A circuit as set forth in claim 19 wherein said sensing means (26) further includes filtering means (30,31) for filtering out direct current components of the audio signal to amplify only the alternating current components to produce said combined control signal.

21. A circuit as set forth in claim 19 including time-delay means (82) for delaying the opening of the power circuit (64) to discontinue power from the power source (20) to the audio power amplifier means (14) for a period of time after said combined control signal is discontinued as a result of the absence of the audio signal.

22. A power circuit (22, 24) for selectively supplying power from a constantly available power source (20) to an audio amplifier means (14) for an audio transducer (12) of the type utilizing first and second input leads (16, 18) having a difference in potential responsive to an audio signal, said control circuit (22, 24) comprising; means (24) connecting the input leads (16, 18) to the audio amplifier means (14) for transmission of the audio signal thereto, sensing means (26) for selectively supplying power from the constantly available power source (20) to the audio amplifier means (14), said sensing means (26) including differential amplifier means (28) for amplifying the audio signal on the input leads (16, 18) to produce an amplified audio signal and comparator means (42) for comparing said amplified audio signal with a minimum magnitude reference voltage to produce a control signal, integrator means (60) for combining said control signal with a second signal responsive to a second pair of input leads (16, 18) driving a second audio amplifier and transducer to produce a combined control signal, and applying said combined control signal to operate a switch means (38) for closing a power circuit (64) to supply power to the amplifier means (14) in response to said combined control signal.

23. A circuit as set forth in claim 22 wherein said sensing means (26) further includes filtering means (30, 31) for filtering out direct current components of the audio signal to amplify only alternating current components to produce said control signal.

24. A circuit as set forth in claim 22 including time-delay means (82) for delaying the opening of the power circuit (64) to discontinue power from the power source (20) to the audio power amplifier means (14) for a period of time after said combined control signal is discontinued as a result of the absence of the audio signal.

25. A method of supplying power from a constantly available power source (20) to an audio amplifier means (14) for an acoustic transducer (12) of the type utilizing first and second input leads (16, 18) having a difference in potential responsive to an audio signal, said method comprising the steps of; connecting the input leads (16, 18) to the audio amplifier means (14) for transmission of the audio signal thereto, sensing the presence of an audio signal for selectively supply power to the amplifier means (14), the sensing (26) of the audio signal being further defined as amplifying (28) the audio signal to produce an amplified audio signal and comparing the amplified audio signal to a minimum magnitude reference voltage to produce a control signal, integrating (60) the control signal and a second control signal in response to an audio signal on a second pair input leads (16, 18) to form a combined control signal, and applying the combined control signal to close a power circuit (64) to power the audio power amplifier means (14).

26. A method as set forth in claim 25 further defined as the connecting including differentially detecting an audio signal on the input leads (16,18) to send to the audio amplifier means.

27. A method as set forth in claim 25 further defined as filtering (30,31) out direct current components of the audio signal to amplify only the alternating current components to produce the combined control signal.

28. A method as set forth in claim 25 further defined as delaying (82) the opening of the power circuit (64) to discontinue power from the power source (20) to the audio amplifier means (14) for a period of time after the combined control signal is discontinued as a result of the absence of the audio signal.

29. A power circuit (22, 24) for selectively supplying power from a constantly available power source (20) to an audio amplifier means (14) for an audio transducer (12) of the type utilizing first and second input leads (16, 18) haing a difference in potential responsive to an audio signal, comprising; means (24) connecting the input leads (16, 18) to the audio amplifier means (14) for transmission of the audio signal thereto, sensing means (26) for selectively supplying power from the constantly available power source (20) to the audio amplifier means (14), said sensing means (26) including differential amplifier means (28) for amplifying the audio signal on the input leads (16, 18) to produce an amplified audio signal and comparator means (42) for comparing said amplified audio signal with a minimum magnitude reference voltage to produce a control signal, said comparator means (42) comprising a comparator operational amplifier (44) having an inverting and noninverting input, first resistor (46) connected to said inverting input and second resistor (48) connected between said inverting and noninverting input and third resistor (50) connected to said noninverting input to act as a voltage divider so that said comparator operational amplifier (44) receives part of the potential of said amplified audio signal to produce said control signal, and switch means (58) for closing a power circuit (64) to supply power to the amplifier means (14) in response to said control signal.

30. A power circuit (22, 24) for selectively supplying power from a constantly available power source (20) to an audio amplifier means (14) for an audio transducer (12) of the type utilizing first and second input leads (16, 18) having a difference in potential responsive to an audio signal, comprising; means (24) connecting the input leads (16, 18) to the audio amplifier means (14) for transmission of the audio signal thereto, sensing means (26) for selectively supplying power from the constantly available power source (20) to the audio amplifier means (14), said sensing means (26) including differential amplifier means (28) for amplifying the audio signal on the input leads (16, 18) to produce an amplified audio signal and comparator means (42) for comparing said amplified audio signal with a minimum magnitude reference voltage to produce a control signal, filter means (54) for receiving said amplified audio signal and filtering out direct current components for said comparator means (42), and switch means (58) for closing a power circuit (64) to supply power to the amplifier means (14) in response to said control signal.

* * * * *